(12) United States Patent
Shinoda

(10) Patent No.: US 7,385,672 B2
(45) Date of Patent: Jun. 10, 2008

(54) EXPOSURE APPARATUS AND METHOD

(75) Inventor: Ken-ichiro Shinoda, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/064,635

(22) Filed: Feb. 24, 2005

(65) Prior Publication Data

US 2005/0190350 A1     Sep. 1, 2005

(30) Foreign Application Priority Data

Feb. 26, 2004   (JP)   .............................. 2004-052330

(51) Int. Cl.
G03B 27/42       (2006.01)
G03B 27/54       (2006.01)

(52) U.S. Cl. .......................................... 355/53; 355/67
(58) Field of Classification Search ................ 355/53, 355/55, 56, 67–71, 77, 52; 359/821; 250/548; 356/399–401
See application file for complete search history.

(56) References Cited

U.S. PATENT DOCUMENTS

| | | | |
|---|---|---|---|
| 5,424,803 A | 6/1995 | Noguchi | |
| 5,436,692 A | 7/1995 | Noguchi | |
| 5,798,838 A | 8/1998 | Taniguchi et al. | |
| 5,925,887 A | 7/1999 | Sakai et al. | |
| 6,078,380 A * | 6/2000 | Taniguchi et al. | 355/52 |
| 6,127,095 A | 10/2000 | Kudo | |
| 6,333,777 B1 * | 12/2001 | Sato | 355/53 |
| 6,404,482 B1 * | 6/2002 | Shiraishi | 355/53 |
| 6,411,364 B1 * | 6/2002 | Suzuki | 355/53 |
| 6,927,836 B2 * | 8/2005 | Nishinaga | 355/53 |
| 2001/0048514 A1 * | 12/2001 | Taniguchi | 355/53 |
| 2002/0008863 A1 | 1/2002 | Taniguchi et al. | |
| 2002/0171815 A1 * | 11/2002 | Matsuyama et al. | 355/55 |
| 2003/0090640 A1 * | 5/2003 | Fujisawa et al. | 355/53 |
| 2003/0197847 A1 * | 10/2003 | Shinoda | 355/67 |
| 2004/0022068 A1 | 2/2004 | Shiozawa | |

FOREIGN PATENT DOCUMENTS

| | | |
|---|---|---|
| EP | 1336898 A2 | 8/2003 |
| JP | 11-87232 A | 3/1999 |
| JP | 3186011 B2 | 5/2001 |
| JP | 2003-318086 A | 11/2003 |

* cited by examiner

Primary Examiner—Hung Henry Nguyen
(74) Attorney, Agent, or Firm—Morgan & Finnegan, LLP

(57) ABSTRACT

An exposure apparatus for exposing a pattern of a reticle onto an object to be exposed, via a projection optical system, utilizing exposure light, includes an optical element for determining a shape of an effective light source on a predetermined surface that substantially has a Fourier transformation relationship with the reticle, a detector for detecting the shape of the effective light source and a light intensity on the object, and a corrector for correcting a variance of performance of the projection optical system, and a controller for controlling the corrector based on a detection result of the detector.

8 Claims, 13 Drawing Sheets

OPTICAL AXIS

EXPOSURE APPARATUS AND METHOD

BACKGROUND OF THE INVENTION

The present invention relates generally to exposure, and more particularly to an exposure apparatus and method that exposes an object, such as a single crystal substrate for a semiconductor wafer, and a glass plate for a liquid crystal display ("LCD").

Along with the recent demands for smaller and lower profile electronic devices, the finer processing of the semiconductor devices to be mounted onto these electronic devices has been increasingly demanded. For example, a design rule attempts to form a circuit pattern of 100 nm or less, and it is expected to shift to a formation of circuit patterns of 80 nm or less in the future. The mainstream photolithography technology has conventionally used a projection exposure apparatus that projects and transfers a pattern on a mask (a reticle) onto a wafer.

The minimum critical dimension to be transferred by the projection exposure apparatus (resolution) is proportionate to a wavelength of light used for exposure, and inversely proportionate to the numerical aperture of the projection optical system. Therefore, the short wavelength of the exposure light and the high NA of the projection optical system have been promoted but they are not enough to satisfy the demand for the finer processing.

Accordingly, the technology that forms an effective light source distribution optimal to a reticle pattern (or the modified illumination) has now attracted attention. The effective light source distribution is formed by driving plural elements in the illumination optical system. A driven position of each element is stored or calculated as a device parameter. The "effective light source", as used herein, means an angular distribution of the exposure light incident upon the wafer surface or a light intensity distribution on the pupil surface in the projection optical system. The effective light source distribution is formed by desirably shaping the light intensity distribution on the pupil surface in the projection optical system or a Fourier transformed surface of the reticle surface, such as a surface near the exit surface of the fly-eye lens. The modified illumination generally uses an annular illumination, a dipole illumination, a quadruple illumination, etc.

The repetitive exposures often cause absorptions of the exposure light energy and thermal deformations of the projection optical system, and a variance of its performance (such as the imaging magnification, imaging position, curvature of field, distortion, spherical aberration, and astigmatism) as a result of the heat radiation, deteriorating the imaging performance. The prior art proposes a method that includes the steps of calculating a variance amount of the exposure performance of the projection optical system using, as parameters, the total dose of the light that transmits the reticle pattern, the necessary exposure time period, and the time interval between exposures in addition to the time constant peculiar to the projection optical system, and correcting the variance amount through controls over driving of the wafer stage, driving of the projection lens, pressure between lenses, and fine adjustments of the wavelength of the exposure light. See, for example, Japanese Patent No. 3,186,011.

The exposure apparatus can, for example, previously store various correction amounts of the projection optical system corresponding to the effective light source distributions (such as the imaging magnification, imaging position, curvature of field, distortion, spherical aberration, and astigmatism during exposure), and use these correction amounts for the exposure. In exposure, it is sufficient only to select the optimal effective light source distribution for a reticle pattern, and the various correction amounts corresponding to the effective light source distribution do not have to be considered during the exposure.

The recent technology enables a diffraction optical element, such as a computer generated hologram ("CGH") to form a desired effective light source distribution, and mount, for example, the diffraction optical element that forms a new effective light source distribution, onto an exposure apparatus at an arbitrary timing.

However, an effective light source distribution formed by the newly mounted diffraction optical element may possibly deteriorate the imaging performance and yield, because the exposure apparatus does not store the corresponding correction amount.

BRIEF SUMMARY OF THE INVENTION

The present invention is directed to an exposure apparatus and method, which can correct a variance of the performance of the projection optical system for an arbitrary effective light source distribution, and maintain the imaging performance and yield.

An exposure apparatus according to one aspect of the present invention for exposing a pattern of a reticle onto an object to be exposed, via a projection optical system, utilizing exposure light, includes an optical element for determining a shape of an effective light source on a predetermined surface that substantially has a Fourier transformation relationship with the reticle, a detector for detecting the shape of the effective light source and a light intensity on the object, and a corrector for correcting a variance of performance of the projection optical system, and a controller for controlling the corrector based on a detection result of the detector.

An exposure method according to another aspect of the present invention for exposing a pattern of a reticle onto an object via a projection optical system utilizing exposure light, includes a first storing step of storing a shape of an effective light source on a predetermined surface that substantially has a Fourier transformation relationship with the reticle, and a correction amount used to correct a variance of performance of the projection optical system corresponding to the shape of the effective light source, a determining step of determining at the time of exposure whether the shape of the effective light source is the shape stored in the first storing step, a calculating step of obtaining the shape of the effective light source and a light intensity on the object, and for calculating a correction amount used to correct the variance of the performance of the projection optical system corresponding to the shape of the effective light source, when the determining step determines that the shape of the effective light source has not yet been stored, and a second storing step of storing a relationship between the shape of the effective light source calculated by the calculating step and the variance of the performance of the projection optical system.

An exposure method according to still another aspect of the present invention for exposing a pattern of a reticle onto an object via a projection optical system utilizing exposure light, include the steps of storing a shape of an effective light source on a predetermined surface that substantially has a Fourier transformation relationship with the reticle, and a correction amount used to correct a variance of performance of the projection optical system corresponding to the shape of the effective light source, determining at the time of exposure whether the shape of the effective light source is the shape stored in the first storing step, selecting the closest one of the shapes of the effective light source stored in the storing step, when the determining step determines that the shape of the effective light source has not yet been stored, and correcting the variance of the performance of the projection optical system based on a correction amount used to correct the variance of the performance of the projection optical system corresponding to the one of shapes of the effective light source selected by the selecting step.

Other objects and further features of the present invention will become readily apparent from the following description of the preferred embodiments with reference to accompanying drawings.

DETAILED DESCRIPTION OF THE PREFERRED EMBODIMENTS

Figure 1:
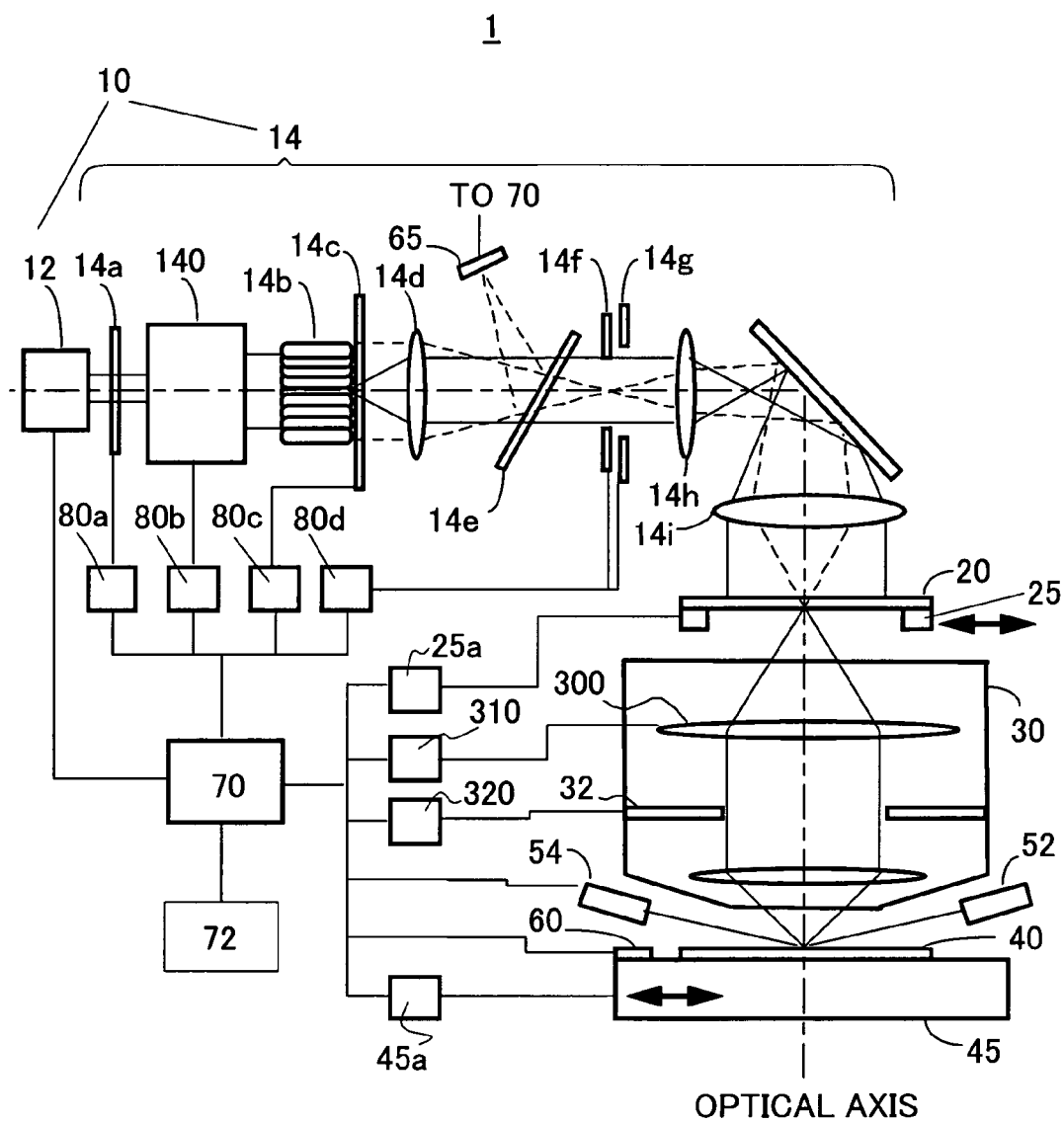
FIG. 1 is a schematic block diagram of an exposure apparatus as one aspect of the present invention.

Referring now to the accompanying drawings, a description will be given of the exposure apparatus 1 according to one aspect of the present invention. In each figure, those elements, which are the corresponding elements, are designated by the same reference numerals, and a duplicate description thereof will be omitted. FIG. 1 is a schematic block diagram of the exposure apparatus 1.

The exposure apparatus 1 is a projection exposure apparatus that exposes a circuit pattern of a reticle 20 onto an object 40, e.g., in a step-and-repeat or a step-and-scan manner. Such an exposure apparatus is suitable for a sub-micron or quarter-micron lithography process, and this embodiment exemplarily describes a step-and-scan exposure apparatus (which is also called "a scanner"). The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection.

The exposure apparatus 1 includes, as an illumination apparatus 10, a reticle stage 25 mounted with the reticle 20, a projection optical system 30, a wafer stage 45 mounted with the object 40, an irradiation part 52 and a light receiving part 54 which serve as a focus position detecting mechanism, a detector 60, a controller 70 and a memory 72.

The illumination apparatus 10 illuminates the reticle 20 which has a circuit pattern to be transferred, and includes a light source section 12 and an illumination optical system 14.

The light source section 12 uses, for example, a laser. The laser may use an ArF excimer laser with a wavelength of approximately 193 nm, a KrF excimer laser with a wavelength of approximately 248 nm, etc., but the type of the light source is not limited to the excimer laser and may use, for example, an $F_2$ laser with a wavelength of approximately 157 nm and an extreme ultraviolet ("EUV") light having a wavelength of approximately 20 nm.

The illumination optical system 14 is an optical system that illuminates a target surface, such as the reticle 20 that has a desired pattern, using the light emitted from the light source 12, and includes a beam attenuator 14a a beam shaping optical system 140, an optical integrator 14b, a stop 14c, a condenser lens 14d, a half mirror 14e, a variable slit 14f, and a field stop 14g, and imaging lenses 14h and 14i.

The beam attenuator 14a includes plural light control filters (ND filters) that respectively have different transmittances in this embodiment. The beam attenuator 14a combines plural ND filters and executes fine adjustments to the attenuation ratio via an ND driver 80a controlled by the controller 70 so as to maintain the optimal exposure dose on the object 40 surface.

The beam shaping optical system 140 includes plural optical elements and zoom lenses. The beam shaping optical system 140 converts light intensity distribution and angular distribution of the light incident upon the subsequent optical integrator 14b to desired distributions.

Figure 2:
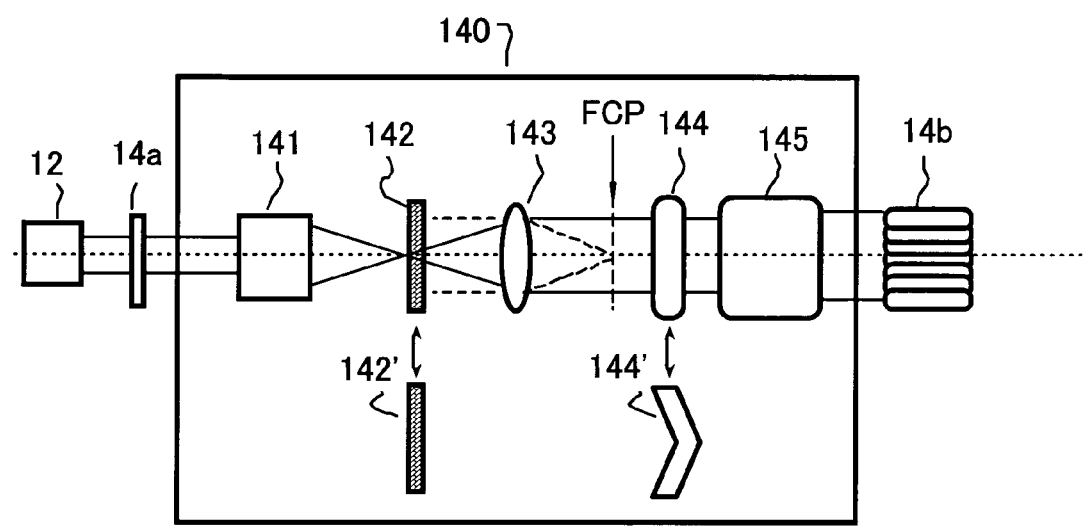
FIG. 2 is a schematic block diagram of one illustrative structure of a beam shaping optical system shown in FIG. 1.

FIG. 2 is a schematic block diagram of one illustrative structure of the beam shaping optical system 140. The beam shaping optical system 140 includes an exit angle defining optical system 141, an optical element 142, a condenser lens 143, an input lens 144, and a condenser zoom lens 145 in this embodiment.

The exit angle defining optical system 141 defines an NA of the light incident upon the subsequent optical element 142.

The optical element 142 forms a desired light intensity distribution (or the shape of the effective light source) on a surface FCP that is Fourier-transformed by the condenser lens 143. The optical element 142 is adapted to replaceable with plural optical elements 142' that form different effective light source shapes.

Figure 3:
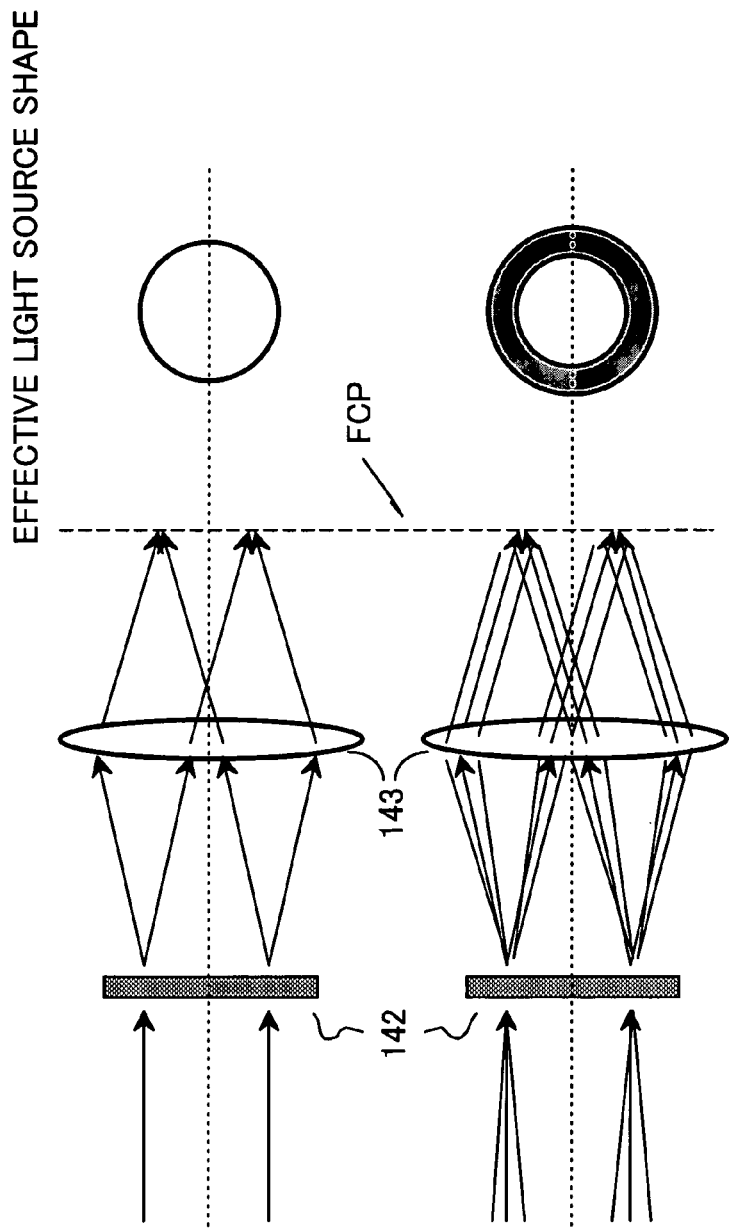
FIGS. 3A and 3B show an optical path and an effective light source shape near an optical element shown in FIG. 2.

The optical element 142 is a diffraction optical element or a CGH in this embodiment, and is designed to form a desired light intensity distribution on a Fourier transformation surface FCP having a Fourier transformation relationship with the optical element 142. FIG. 3A shows that the collimated light is incident upon the optical element 142 that forms an annular effective light source. FIG. 3B shows that the light having an angular distribution or NA is incident upon the optical element 142.

The optical element 142 that forms the annular effective light source is designed and manufactured, as shown in FIG. 3A, so that the diffracted light from the incident collimated light forms an annular light intensity distribution with an annular width on the Fourier transformation surface FCP. When the light having a certain NA is incident upon the optical element 142 as shown in FIG. 3B, the image blurs on the Fourier transformation surface FCP and forms a light intensity distribution having an annular width as shown in FIG. 3B. Therefore, by making variable the NA that is defined the exit angle defining optical system 141 (for example, by switchably arranging the optical system that emits different NAs or by using the NA-variable zoom optical system), the effective light source shape (or the annular width) formed by the optical element 142 can be variably adjusted.

The input lens 144 includes plural replaceable input lenses 144' that have conical surfaces or polygonal pyramid surface at an incident surface or an exit surface or both surfaces.

The condenser zoom lens 145 condenses the light from the input lens 144 into the incident surface of the optical integrator 14b. The condenser zoom lens 145 images an exit surface vicinity of the input lens 144 on the incident surface of the optical integrator 14b at a predetermined magnification. The object surface of the condenser zoom lens 145 and the optical integrator 14b have a substantially conjugate relationship. The condenser zoom lens 145 that is a zoom lens with a variable magnification can adjust the light area incident upon the optical integrator 14b and form plural illumination conditions.

Figure 4:
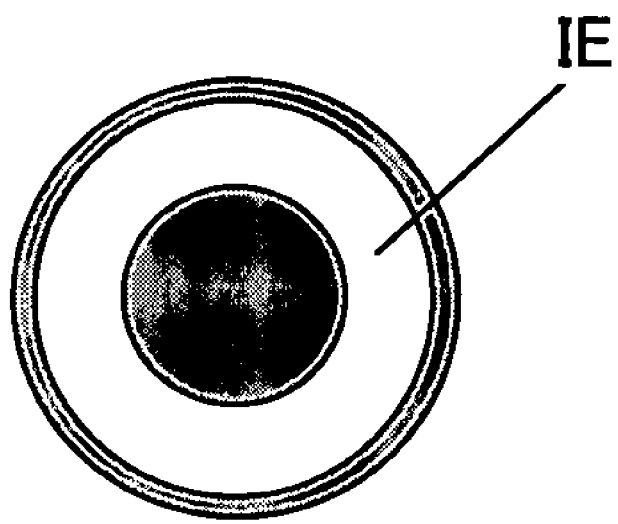
FIG. 4 is a view showing an annular effective light source shape.
Figure 5:
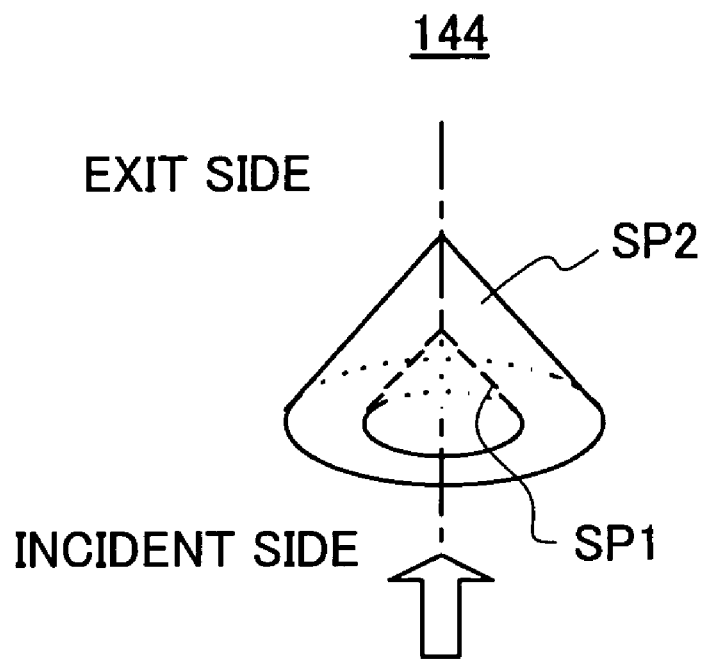
FIG. 5 is a schematic transparent view showing a prism as one example of an input lens for forming the effective light source shape shown in FIG. 4.

In forming the effective light source having the annular illumination area IE shown in FIG. 4, the beam shaping optical system 140 shown in FIG. 2 can directly form the annular light intensity distribution using the optical element 142 without the input lens 144. Alternatively, when the optical element 142 forms a circular light intensity distribution and the input lens 144 includes a prism as shown in FIG. 5, which has a concave conical or plane surface SP1 at the incident side and a convex conical surface SP2 at an exit side, the effective light source has the annular illumination area IE shown in FIG. 4. Here, FIG. 4 is a view of the annular effective light source. FIG. 5 is a schematic transparent view of the prism as one example of the input lens 144 used to form the effective light source shape shown in FIG. 4.

Figure 6:
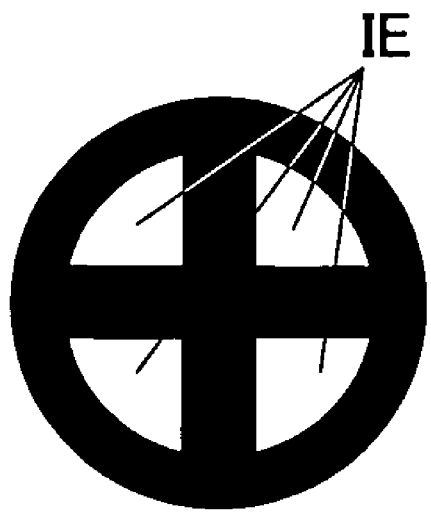
FIG. 6 is a view showing a quadrupole effective light source.
Figure 7:
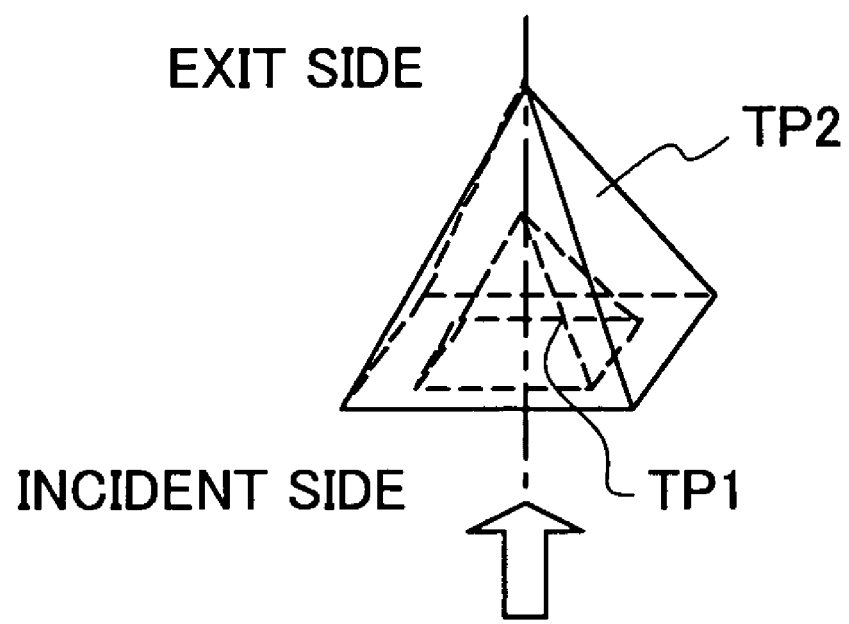
FIG. 7 is a schematic transparent view showing a prism as one example of the input lens for forming the effective light source shape shown in FIG. 6.

In forming the effective light source having a quadrupole illumination area IE shown in FIG. 6, the optical element 142 may directly form the quadrupole light intensity distribution. Alternatively, when the optical element 142 forms a circular light intensity distribution and the input lens 144 includes a prism as shown in FIG. 7, which has a concave conical or plane surface TP1 at the incident side and a convex conical surface TP2 at an exit side, the effective light source has the quadrupole illumination area IE shown in FIG. 6. Here, FIG. 6 is a view of the quadrupole effective light source. FIG. 7 is a schematic transparent view of the prism as one example of the input lens 144 used to form the effective light source shape shown in FIG. 6.

The zoom shaping optical system 140 forms the effective light source directly through the optical element 142 or a combination of the optical element 142 and the input lens 144, prevents unnecessary light shielding of the stop 14c arranged near the exit surface of the optical integrator 14b, and forms the effective light source distribution at high illumination efficiency.

A combination with the condenser zoom lens 145 can maintain the light intensity distribution formed by the optical element 142 and the input lens 144, enlarge the light intensity distribution, and adjust the size of the effective light source shape (an outer a value).

The optical integrator 14b serves as a multi-beam generating means, and two-dimensionally arranges a plurality of micro lenses. The optical integrator 14b forms plural secondary light sources near its exit surface.

The stop 14c is arranged near the exit surface of the optical integrator 14b. The stop 14c is variable in its opening size and shape via the opening driver 80c controlled by the controller 70.

The condenser lens 14d condenses the light emitted from the plural secondary light sources near the exit surface of the optical integrator 14b, and illuminates the field stop 14g as a target surface in a superimposition manner for making uniform the light intensity on that surface.

The half mirror 14e reflects several percentages of the light emitted from the optical integrator 14b to guide the light to an integral exposure dose detector 65. The integral exposure dose detector 65 is a photodetector, such as an illuminometer, for always detecting the exposure dose during exposure, is arranged at a position optically conjugate with the reticle 20 and the object 40, and sends a signal corresponding to the output result to the controller 70.

The field stop 14g includes a plurality of movable light-shielding plates, forms an arbitrary opening shape via the field driver 80d controlled by the controller 70, and restricts an exposure area on the object 40 surface. The field stop 14g scans in synchronization with the reticle stage 25 and the wafer stage 45. The variable stop 14f is arranged near the incident side of the field stop 14g to restrict the illumination area of the object 40 and improve the light intensity uniformity on the scan-exposed surface.

The imaging lenses 14h and 14i transfer an opening shape of the field stop 14g onto the reticle 20 surface as a target surface, and illuminate the necessary area on the reticle 20 surface uniformly.

The reticle 20 is made, for example, of quartz, has a circuit pattern (or an image) to be transferred, and is supported and driven by the reticle stage 25 connected to a drive mechanism 25a. The diffracted light emitted from the reticle 20 passes the projection optical system 30, and then is projected onto the object 40. The reticle 20 and the object 40 are located in an optically conjugate relationship. The exposure apparatus 1 is a scanner, and scans the reticle 20 and the object 40, thus transferring the entire reticle pattern onto the object 40.

The projection optical system 30 images the light from the object surface, such as the reticle, onto the image surface, such as the object 40. The projection optical system 30 may use an optical system solely including a plurality of lens elements, a (catadioptric) optical system including a plurality of lens elements and at least one mirror, an optical system including a plurality of lens elements and at least one diffractive optical element such as a kinoform, and a catoptric optical system of a full mirror type, and so on. Any necessary correction of the chromatic aberration may use a plurality of glass lens elements having different dispersion values (Abbe values), or arrange a diffraction optical element such that it disperses in a direction opposite to that of the lens element.

The projection optical system 30 includes a NA (or aperture) stop 32, and plural lenses 300 in this embodiment, and images the diffracted light diffracted by the pattern of the reticle 20 onto the object 40. The NA stop 32 changes its opening size via a NA driver 320 controlled by the controller 70, and changes the NA of the projection optical system 30.

The lens 300 is connected to a lens driver 310, and moved in the optical-axis direction. The lens driver 310 is controlled by the controller 70, drives the lens 300 in the optical-axis direction and changes its position, and varies the projection magnification of the projection optical system 30. The lens driver 310 is connected to a lens (not shown) in the projection optical system 30, and driving of this lens would change the field of curvature, the distortion, the spherical aberration, and the astigmatism.

The object 40 is a wafer in this embodiment, but may cover a liquid crystal substrate and another object to be exposed. A photoresist is applied onto the object 40.

The wafer stage 45 is connected to the drive mechanism 45a controlled by the controller 70, and drives and supports the object 40. The wafer stage 45 may use any structure known in the art, and a detailed description of its structure and operation is omitted. The wafer stage 45 may use, for example, a linear motor to two-dimensionally move the object 40 in the optical-axis direction and on the plane perpendicular to the optical-axis direction. The reticle 20 and the object 40 are, for example, scanned synchronously, and the positions of the reticle stage 25 and wafer stage 45 are monitored, for example, by a laser interferometer and the like, so that both are driven at a constant speed ratio. The wafer stage 45 is installed on a stage stool supported on the floor and the like, for example, via a damper, and the reticle stage 25 and the projection optical system 30 are installed on a barrel stool (not shown) supported, for example, via a damper to the base frame placed on the floor.

The focus position detecting mechanism detects a position or height of the object 40 surface in the optical-axis direction, and includes the irradiation part 52 and the light receiving part 54. The focus position detecting mechanism emits the irradiation light onto the object 40 surface from the irradiation part 52, and detects the position of the object by receiving the reflected light from the object 40 surface using the light receiving part 54, and sends the positional information to the controller 70. The drive mechanism 45a controls the position and angle of the object 40 based on the positional information from the controller 70, and always accords the object 40 surface onto the imaging position by the projection optical system 30.

The detector 60 is provided near the object 40 surface, or more specifically on the wafer stage 45, and serves to measure the shape of the effective light source. The detector 60 is a photodetector, such as an illuminometer, for always detecting the exposure light dose incident upon the object 40 surface, accords the light receiving part with the object 40 surface, receives the illumination light in the illumination area together with driving of the wafer stage 45, and sends the result to the controller 70. The detector 60 is a photodetector in this embodiment, but may be a two-dimensional CCD.

Figure 8:
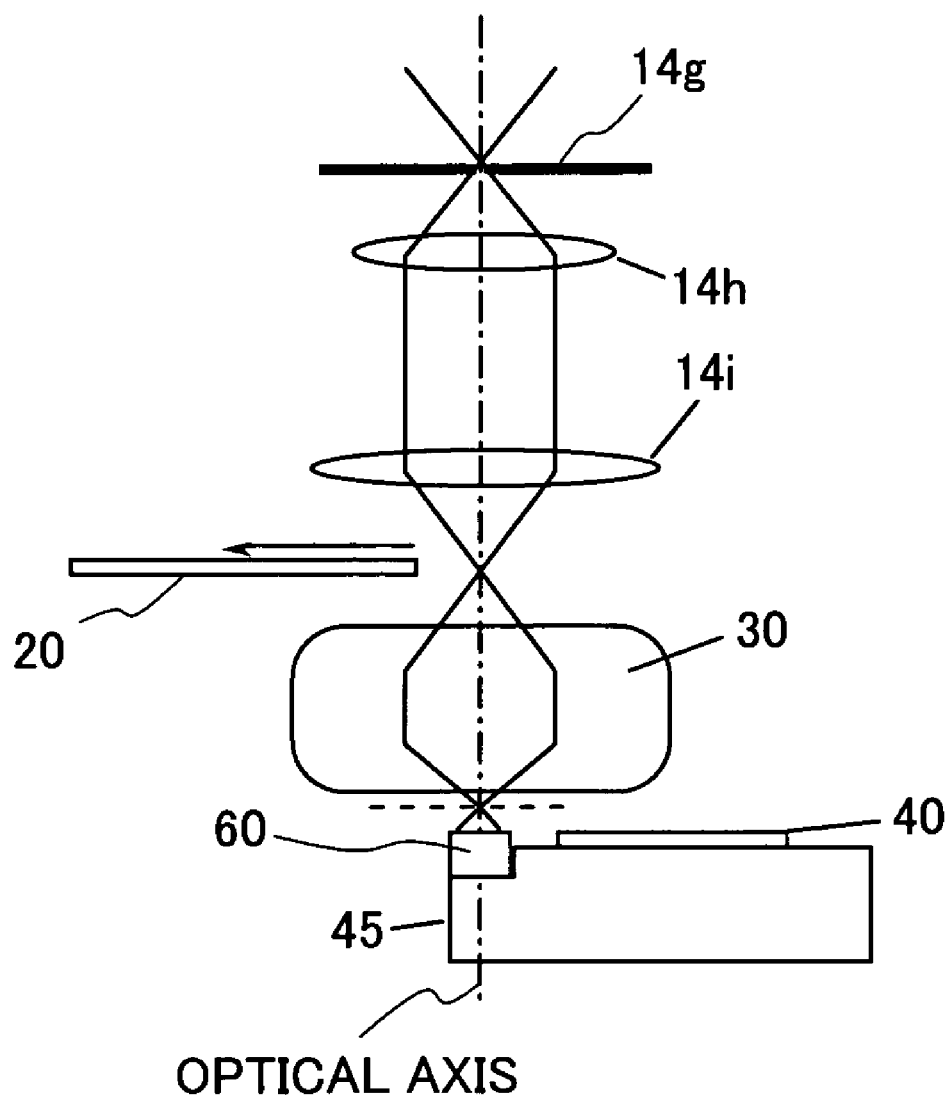
FIG. 8 is a view for explaining one illustrative method for detecting the effective light source shape in the exposure apparatus shown in FIG. 1.

A description will now be given of a detection of the shape of the effective light source (or the angular distribution of the exposure light) using the detector 60. Although various methods of detecting the shape of the effective light source are conceivable, one method is to drive the field stop 14g and set a fine opening to a position to be detected, as shown in FIG. 8, and to defocus the detector arranged near the object 40 from the actual wafer reference surface in the optical-axis direction. The reticle 20 is removed from the optical path. Here, FIG. 8 is a view for explaining one illustrative method for detecting the effective light source shape in the exposure apparatus 1.

Referring to FIG. 8, only the exposure light restricted by the field stop 14g images on the object 40 surface once, and enters the detector 60 while its angle is reflected. The detector 60 arranged on the wafer stage 45 that holds the object 40 has a pinhole with a sufficiently small diameter relative to a spread of the light. When the wafer stage 45 horizontally moves the detector 60, for example, in the two-dimensional matrix spreading range, the detector 60 measures the light intensity of the incident exposure light and detects the angular distribution.

Figure 9:
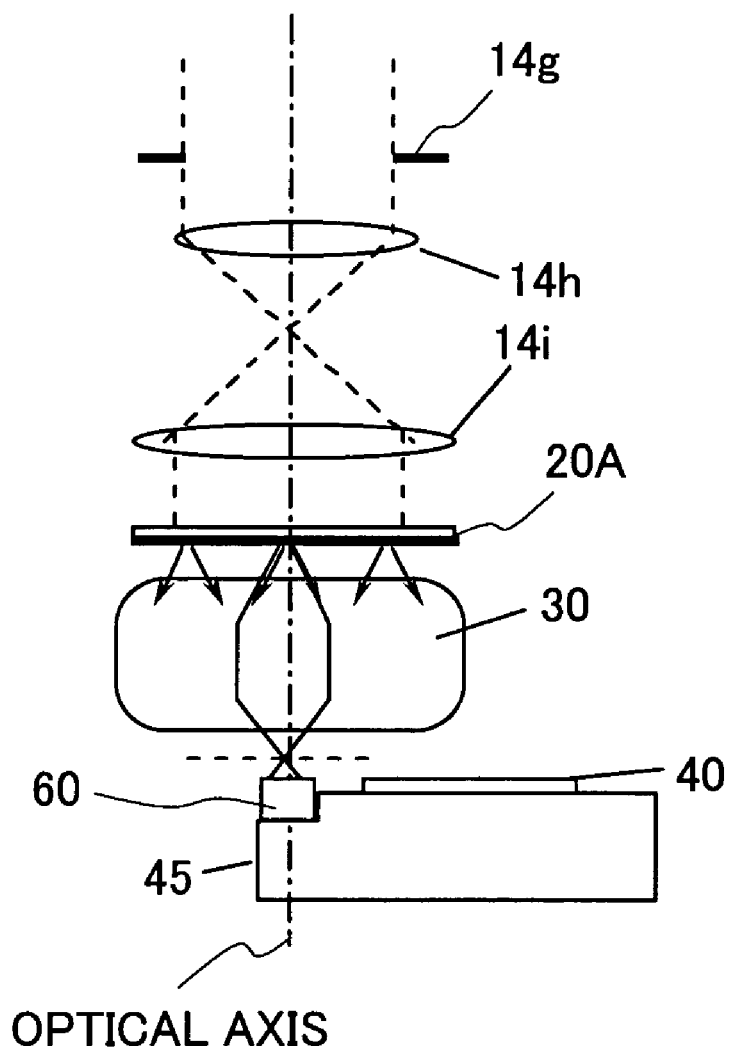
FIG. 9 is a view for explaining one illustrative method for detecting the effective light source shape in the exposure apparatus shown in FIG. 1.

The effective light source shape can also be detected by providing the fine opening at a position conjugate with the field stop 14g. More specifically, one conceivable method is to release the field stop 14g, as shown in FIG. 9, and to arrange a dedicated reticle or a dedicated plate 20A, in which a fine opening is formed by a Cr pattern, etc. Here, FIG. 9 is a view for explaining one illustrative method of detecting the shape of the effective light source in the exposure apparatus 1.

When this method measures an arbitrary position, the effective light source distribution is detectable at each image point. The information representing the total dose of the exposure light incident upon each position, such as the light intensity distribution on the object 40 surface, is also detectable.

The controller 70 serves to control the entire exposure apparatus 1. More specifically, the controller 70 controls the shape of the effective light source via an ND driver 80a, a beam system driver 80b, an opening driver 80c, and a field driver 80d, and controls the scan exposure via the drive mechanisms 25a and 45a. The controller 70 controls driving of the lens driver 310 based on the effective light source shape detected by the detector 60 or the previously stored effective light source shape formed by the illumination optical system 14. In other words, the controller 70 controls (or corrects) the variance of the performance of the projection optical system, such as an imaging magnification, an imaging position, a curvature of field, a distortion, a spherical aberration, and an astigmatism, generated during the repetitive exposures, using the lens driver 310. While Japanese Patent No. 3,186,011 etc. disclose a method for correcting the variance of the performance of the projection optical system 30, another know method is also available.

The memory 72 stores first information indicative of a relationship between the reticle 20's pattern and the shape of the effective light source suitable for the pattern, and second information indicative of a relationship between the shape of the effective light source and the correction amount used to correct the variance of the performance of the projection optical system 30. The first information includes the optimal illumination mode, such as an annular shape and a quadrupole shape for all the patterns applicable to the reticle 20 in the exposure apparatus. The second information includes the variance amount of the performance of the projection optical system 30 corresponding to the effective light source, and the lens that drives via the lens driver 310 so as to correct the variance amount, and the correction amount such as the driving amount of the lens etc.

More specifically, in order to correct the variance of the performance the projection optical system 30 (such as the imaging magnification, the imaging position, the curvature of field, the distortion, the spherical aberration, and the astigmatism) which is caused by an absorption, heating up and radiation of the energy of the exposure light during the repetitive exposures, it is necessary to calculate and store in the memory 72 the correction amount QB relative to the total dose of the exposure light that passes the pattern of the reticle 20, the correction amount Da corresponding to the light intensity distribution of the pattern image (or the transmittance distribution of the reticle pattern), and the correction amount Db corresponding to the shape of the effective light source.

In exposure, the light emitted from the light source section 12 illuminates the reticle 20 via the illumination optical system 14. The light that passes the reticle 20 and reflects the reticle pattern is imaged onto the object 40 by the projection optical system 30. The reticle 20 and the object 40 are synchronously scanned for exposure. When the projection optical system 30 has a reduction ratio of 1/β, and the wafer stage 45 has a scan speed of V [mm/sec], the scan speed of the reticle stage 25 is βV [mm/sec]. The scan direction of the wafer stage 45 opposes to the scan direction of the reticle stage 25.

The exposure apparatus 1 can correct the variance of the performance of the projection optical system 30 (such as the imaging magnification, the imaging position, the curvature of field, the distortion, the spherical aberration, and the astigmatism) during the exposure. Therefore, the exposure apparatus 1 can provide high-quality devices (such as semiconductor devices, LCD devices, image pickup devices (such as CCDs), and thin film magnetic heads) with high resolving power, throughput and economic efficiency.

Figure 10:
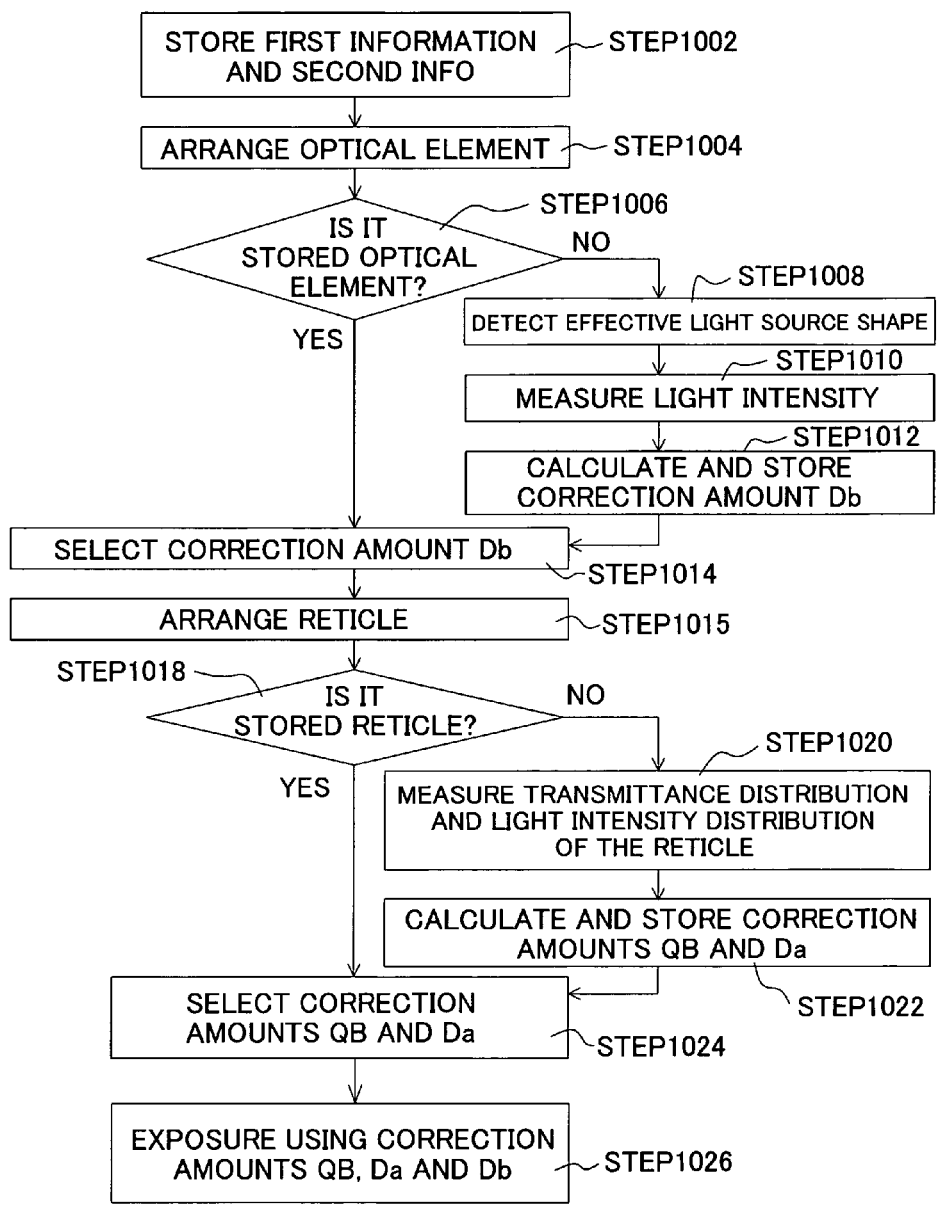
FIG. 10 is a flowchart for explaining an exposure method as one aspect of the present invention.

Referring now to FIG. 10, a description will be given of an exposure method 1000 according to one aspect of the present invention. FIG. 10 is a flowchart for explaining the exposure method 1000. The exposure method 1000 of the instant embodiment illuminates the reticle 20 using the light from the illumination apparatus 10, and exposes the pattern of the reticle 20 onto the object 40 via the projection optical system 30.

Referring to FOG. 10, the memory 72 stores the first information indicative of a relationship between the reticle patterns and the shapes of the effective light sources each of which is suitable for each reticle pattern, and the second information indicative of a relationship between the shapes of the effective light sources and the correction amounts used to correct the variance of the performance of the projection optical system 30 (step 1002) The first information contains plural optical elements 142 and the effective light source shape formed by the optical elements 142.

When the optical element 142' is mounted onto the exposure apparatus 1 (step 1004), the controller 70 determines whether the optical element 142' is one of the plural optical elements 142 stored in the step 1002 (step 1006). This determination uses, for example, an electronic detection of a barcode adhered to each optical element.

Since the optical element 142' is not one of the optical elements 142 stored in the step 1002 in this embodiment, the optical element 142' and the associated exit angle defining optical system 141, condenser lens 143, input lens 144 and condenser zoom lens 145 are driven and a desired illumination condition is set. Then, the detector 60 detects the shape of the effective light source (step 1008), and the light intensity on the object 40 surface without the reticle 20 (step 1010).

The controller 70 calculates the correction amount Db corresponding to the effective light source shape detected by the step 1008, and stores it in the memory 72 with the effective light source shape formed by the optical element 142' (step 1012).

Next, the correction amount Db is selected corresponding to the effective light source formed by the stored optical element 142' (step 1014). In the step 1006, when the optical element 142' is the optical element 142 stored in the step 1002, the procedure proceeds to the step 1014 without intervening the steps 1008, 1010 and 1012.

Next, when the reticle 20 that has a desired pattern is mounted (step 1016), the controller 70 determines whether the reticle 20 is the reticle stored in the step 1002 (step 1018). This determination uses, for example, an electronic detection of a barcode adhered to each optical element.

When the controller 70 determines that the reticle 20 is not the reticle stored in the step 1002, the controller 70 drives the detector 60 two dimensionally on the object 40 and measures the light intensity distribution and the transmittance distribution of the reticle 20 (or the transmittance distribution of the pattern of the reticle 20) (step 1020). The total transmittance of the reticle 20 is also calculated.

After measuring the light intensity distribution and the transmittance distribution of the reticle 20 and obtaining the total transmittance of the reticle 20, the controller 70 calculates the correction amounts QB and Da corresponding to the reticle 20 and stores them in the memory 72 (step 1022).

Next, the correction amounts QB and Da corresponding to the stored reticle 20 are picked up (step 1024). In the step 1018, when the reticle 20 is the reticle stored in the step 1002, the procedure proceeds to the step 1024 without intervening the steps 1020 and 1022. The controller 70 drives the lens 300 in the projection optical system 30 via the lens driver 310 based on the correction amounts QB, Da and Db, and executes exposure (step 1026).

The exposure method 1000 corrects the variance of the performance of the projection optical system 30 (such as the imaging magnification, the imaging position, the curvature of field, the distortion, the spherical aberration, and the astigmatism), which occurs during the exposure, and maintains the imaging performance and yield.

Figure 11:
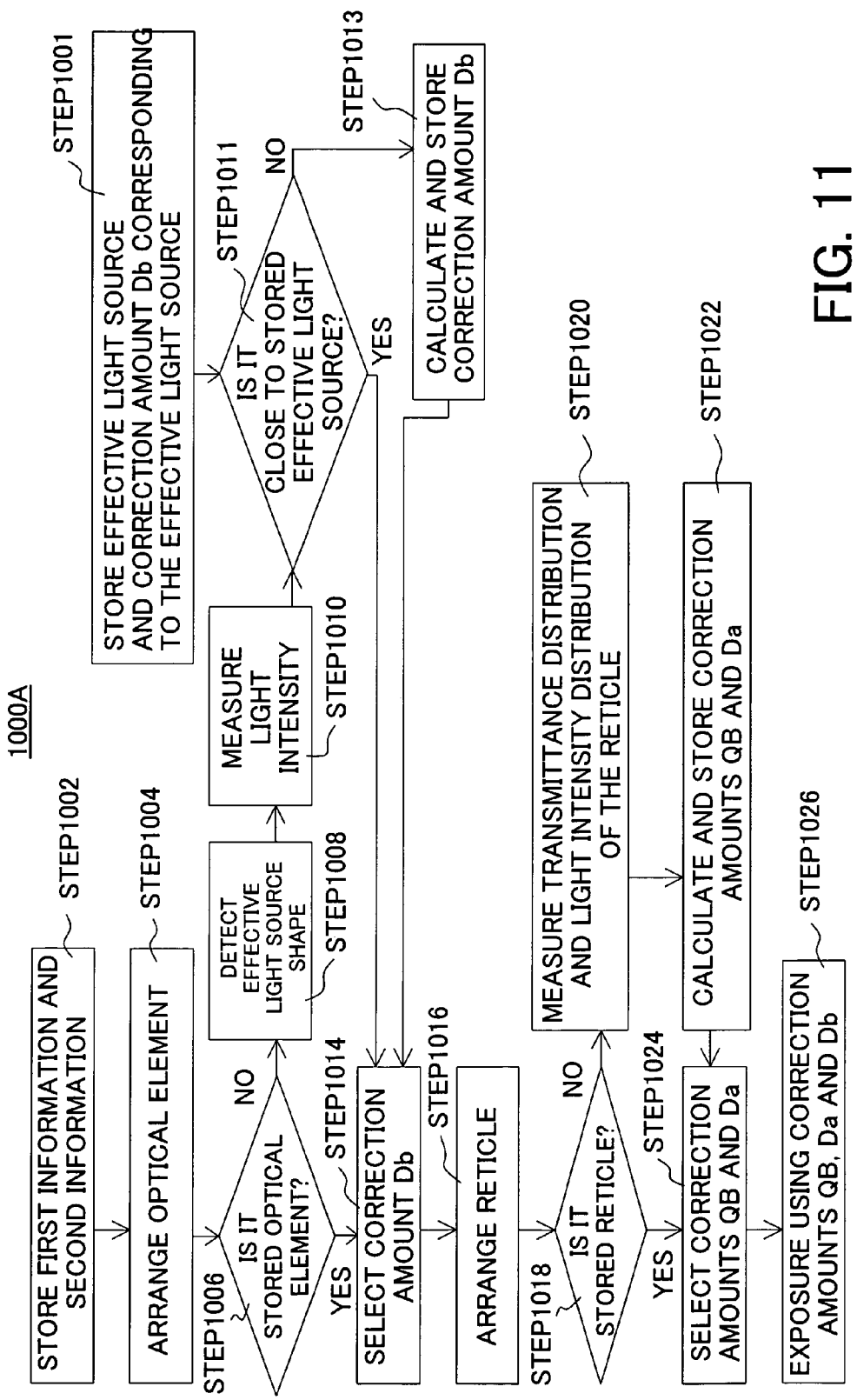
FIG. 11 is a flowchart of a variation of the exposure method shown in FIG. 1.

A description will now be given of an exposure method 1000A as a variation of the exposure method 1000. FIG. 11 is a flowchart for explaining the exposure method 1000A as the variation of the exposure method 1000.

Referring now to FIG. 11, the memory 72 stores the shapes of typical effective light sources, such as an annular shape, a dipole shape, and a quadrupole shape, and the correction amount Db corresponding to the effective light source after these shapes and correction amount Db are obtained through simulations etc. (step 1001).

On the other hand, similar to the exposure method 1000, the memory 72 stores the first information indicative of a relationship between the reticle patterns and the shapes of the effective light sources suitable for the reticle patterns, and the second information indicative of a relationship between the shapes of the effective light sources and the correction amounts used to correct the variance of the performance of the projection optical system 30 (step 1002). When the optical element 142' is mounted onto the exposure apparatus 1 (step 1004), the controller 70 determines whether the optical element 142' is one of the plural optical elements 142 stored in the step 1002 (step 1006). When the controller 70 determines that the optical element 142' is not one of the optical elements 142 stored in the step 1002, a desired illumination condition is set and the detector 60 detects the shape of the effective light source (step 1008), and the light intensity on the object 40 surface without the reticle 20 (step 1010).

Next, the controller determines whether the effective light source shape detected in the step 1008 is the effective light source shape stored in the step 1001 (step 1011). This determination uses, for example, the outer and inner sizes of the illumination area, i.e., outer $\sigma$ and inner $\sigma$, the opening angle ($\theta$) of the illumination area, and its X and Y directions or coordinate.

When the effective light source shape detected by the step 1008 is stored in the effective light source shape, the procedure moves to the step 1014. On the other hand, when the effective light source shape detected by the step 1008 is not stored in the effective light source shape, the actual exposure is repeated using the optical element 142' and the memory 72 stores a relationship between the effective light source shape formed by the optical element 142' and the correction amount Db (step 1013).

Next, the correction amount Db is selected corresponding to the effective light source formed by the stored optical element 142' (step 1014). When the reticle 20 that has a desired pattern is mounted (step 1016), the controller 70 determines whether the reticle 20 is the reticle stored in the step 1002 (step 1018).

When the controller 70 determines that the reticle 20 is not the reticle stored in the step 1002, the controller 70 drives the detector 60 two dimensionally on the object 40 and measures the light intensity distribution and the transmittance distribution of the reticle 20 (or the transmittance distribution of the pattern of the reticle 20) (step 1020). The total transmittance of the reticle 20 is also calculated.

After measuring the light intensity distribution and the transmittance distribution of the reticle 20 and obtaining the total transmittance of the reticle 20, the controller 70 calculates the correction amounts QB and Da corresponding to the reticle 20 and stores them in the memory 72 (step 1022).

Next, the correction amounts QB and Da corresponding to the stored reticle 20 are picked up (step 1024). In the step 1018, when the reticle 20 is the reticle stored in the step 1002, the procedure proceeds to the step 1024 without intervening the steps 1020 and 1022. The controller 70 drives the lens 300 in the projection optical system 30 via the lens driver 310 based on the correction amounts QB, Da and Db, and executes exposure (step 1026).

The exposure method 1000A corrects the variance of the performance of the projection optical system 30 (such as the imaging magnification, the imaging position, the curvature of field, the distortion, the spherical aberration, and the astigmatism), which occurs during the exposure, and maintains the imaging performance and yield.

This embodiment thus detects both the transmission distribution and the effective light source distribution for each pattern of the reticle 20, and calculates the variance amount of the performance of the projection optical system 30 using the correction amounts Da and Db. However, the present invention may detect the effective light source shape, and calculate the variance amount using the correction amount Db without using the correction amount Da. In this case, the correction amount Da is fixed in a value stored in the memory 72.

The present embodiments properly corrects the variance of the performance of the projection optical system corresponding to the effective light source shape even when an effective light source shape is newly set at an arbitrary timing. The present embodiments also corrects the variance of the performance of the projection optical system according to the reticle.

Figure 12:
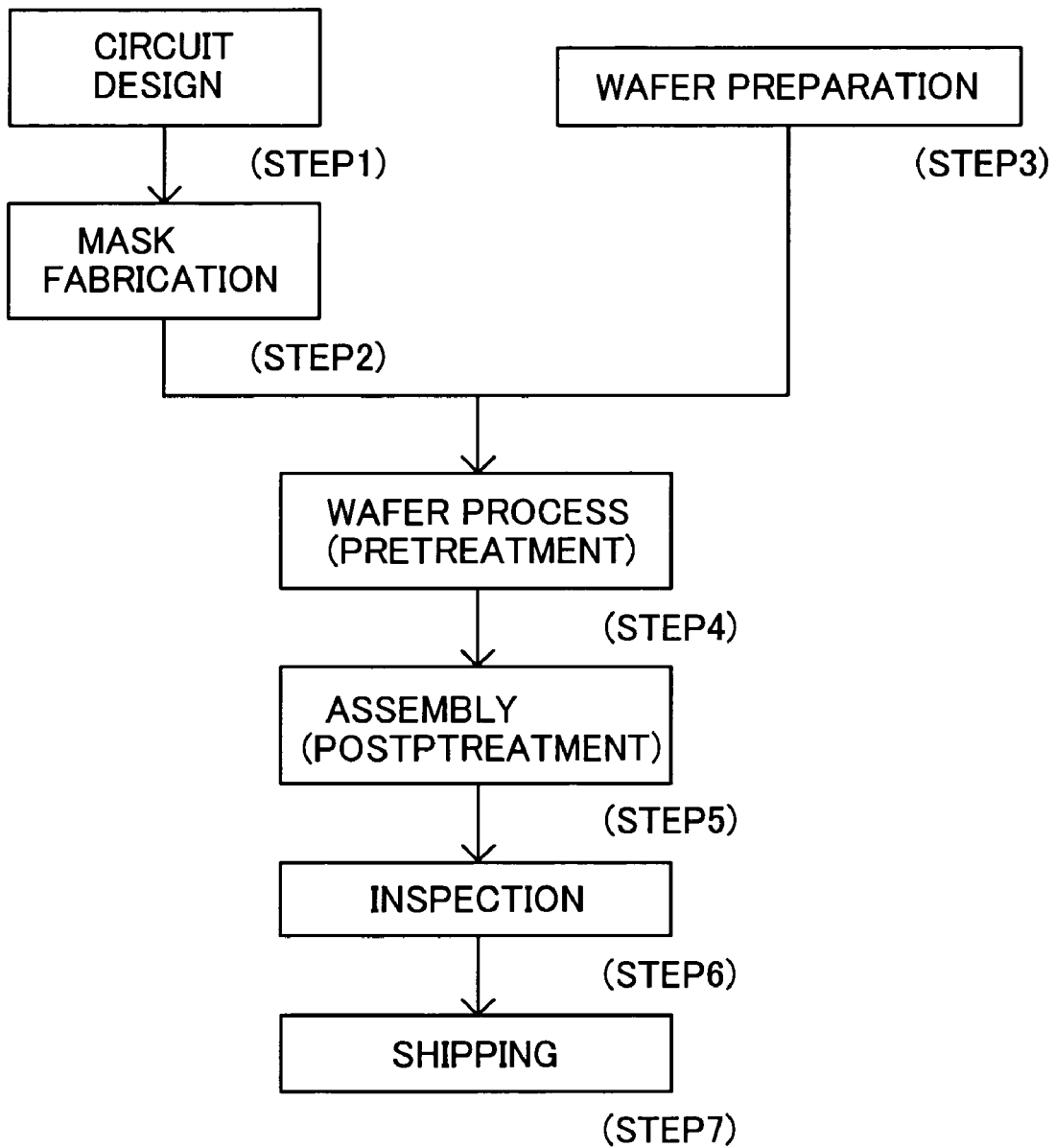
FIG. 12 is a flowchart for explaining a method for fabricating devices (semiconductor chips such as ICs, LSIs, and the like, LCDs, CCDs, etc.).
Figure 13:
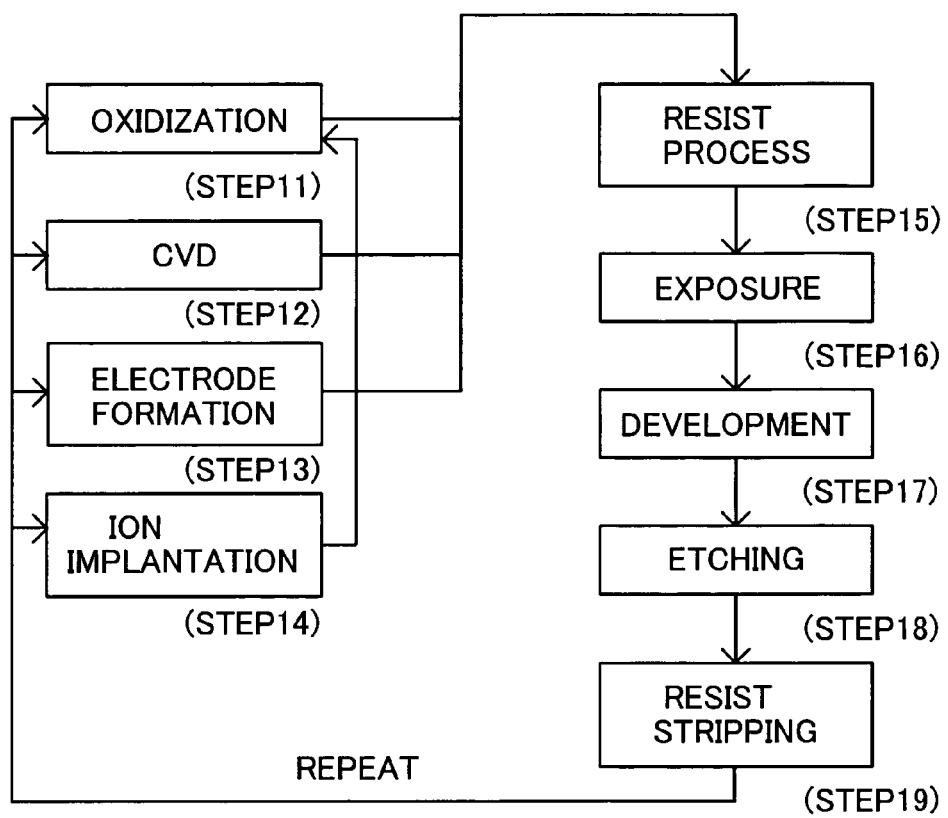
FIG. 13 is a detailed flowchart for Step 4 of wafer process shown in FIG. 12.

Referring now to FIGS. 12 and 13, a description will now be given of an embodiment of a device manufacturing method using the above exposure apparatus 1. FIG. 12 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 13 is a detailed flowchart of the wafer process in Step 4 shown in FIG. 12. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The manufacturing method of the present invention can manufacture semiconductor devices which have been difficult to manufacture. Thus, the device manufacturing method that uses the exposure apparatus 1, and its resultant (intermediate and final) products also constitute one aspect of the present invention.

The present invention is not limited to these preferred embodiments, and various variations and modifications may be made without departing from the scope of the present invention.

This application claims a foreign priority based on Japanese Patent Application No. 2004-052330, filed Feb. 26, 2004, which is hereby incorporated by reference herein.

What is claimed is:

1. An exposure apparatus comprising:
    a projection optical system for projecting a pattern of a reticle onto an object to be exposed, using exposure light;
    an optical element for determining a shape of an effective light source on a plane that has a Fourier transformation relationship with the reticle;
    a light detector for detecting the shape of the effective light source and a light intensity of the exposure light on image plane of the projection optical system; and
    a controller for changing performance of the projection optical system,
    wherein the light detector detects the first light intensity on an image plane of the projection optical system when the reticle is not arranged at an object plane of the projection optical system, and the second light intensity on the image plane of the projection optical system when the reticle is arranged at the object plane of the projection optical system, and
    wherein the controller changes the performance of the projection optical system based on the shape of the effective light source, the first light intensity and the second light intensity detected by the light detector.

2. An exposure apparatus according to claim 1, wherein the light detector detects a light intensity distribution on the image plane of the projection optical system when the reticle is arranged on the object plane of the projection optical system.

3. An exposure apparatus according to claim 1, wherein the performance of said projection optical system contains at least one of an imaging magnification, an imaging position, a curvature of field, a distortion, a spherical aberration, and an astigmatism.

4. An exposure apparatus according to claim 1, further comprising a memory that stores first information indicative of a relationship between the patterns and the shapes of the effective light sources each of which is suitable for each pattern, and second information indicative of a relationship between the shapes of the effective light sources and the correction amounts by each of which said controller corrects a variance of the performance of the projection optical system.

5. A device manufacturing method comprising the steps of:
   exposing an object using an exposure apparatus according to claim 1; and
   developing the object that has been exposed.

6. An exposure method for exposing a pattern of a reticle onto an object via a projection optical system utilizing exposure light, said exposure method comprising the steps of:
   obtaining a shape of an effective light source on a plane that has a Fourier transformation relationship with the reticle;
   obtaining a first light intensity of the exposure light on an image plane of the projection optical system when the reticle is not arranged at an object plane of the projection optical system, and the second light intensity on the image plane of the projection optical system when the reticle is arranged at the object plane of the projection optical system; and
   changing performance of the projection optical system based on the shape of the effective light source and the first light intensity and the second light intensity obtained in said obtaining step.

7. An exposure method according to claim 6, further comprising the steps of:
   detecting a transmittance distribution of the reticle; and
   changing the performance of the projection optical system based on the transmittance distribution detected by said detecting step.

8. An exposure method according to claim 7, further comprising the step of:
   storing the shape of the effective light source and a correction amount used to correct a variance of performance of the projection optical system corresponding to the shape of the effective light source.

* * * * *